(12) United States Patent
Zhu et al.

(10) Patent No.: US 9,752,643 B2
(45) Date of Patent: Sep. 5, 2017

(54) NEGATIVE STIFFNESS SYSTEM FOR GRAVITY COMPENSATION OF MICROPOSITIONER

(71) Applicants: SHANGHAI MICRO ELECTRONICS EQUIPMENT CO., LTD., Shanghai (CN); TSINGHUA UNIVERSITY, Beijing (CN)

(72) Inventors: Yu Zhu, Beijing (CN); Ming Zhang, Beijing (CN); Zhao Liu, Beijing (CN); Rong Cheng, Beijing (CN); Jing Wang, Beijing (CN); Li Tian, Beijing (CN); Dengfeng Xu, Beijing (CN); Kaiming Yang, Beijing (CN); Jinchun Hu, Beijing (CN); Wensheng Yin, Beijing (CN); Haihua Mu, Beijing (CN); Hao Liu, Beijing (CN); Chuxiong Hu, Beijing (CN)

(73) Assignees: SHANGHAI MICRO ELECTRONICS EQUIPMENT CO., LTD., Shanghai (CN); TSINGHUA UNIVERSITY, Beijing (CN)

( * ) Notice: Subject to any disclaimer, the term of this patent is extended or adjusted under 35 U.S.C. 154(b) by 26 days.

(21) Appl. No.: 14/652,055

(22) PCT Filed: Dec. 6, 2013

(86) PCT No.: PCT/CN2013/088753
§ 371 (c)(1),
(2) Date: Jul. 15, 2015

(87) PCT Pub. No.: WO2014/090115
PCT Pub. Date: Jun. 19, 2014

(65) Prior Publication Data
US 2015/0369331 A1  Dec. 24, 2015

(30) Foreign Application Priority Data
Dec. 12, 2012 (CN) .......................... 2012 1 0537786

(51) Int. Cl.
*F16F 15/067* (2006.01)
*G03F 7/20* (2006.01)

(52) U.S. Cl.
CPC .............. *F16F 15/067* (2013.01); *G03F 7/70* (2013.01); *F16F 2228/063* (2013.01)

(58) Field of Classification Search
CPC .......... F16F 15/02; F16F 15/04; F16F 15/046; F16F 15/06; F16F 15/067; F16F 2228/06; F16F 2228/063; G03F 7/20
See application file for complete search history.

(56) References Cited

FOREIGN PATENT DOCUMENTS

| CN | 85109107 A | 5/1987 |
|---|---|---|
| CN | 202132428 U | 2/2012 |

(Continued)

OTHER PUBLICATIONS

English machine translation of CN 102410337 (Zhu).*
(Continued)

*Primary Examiner* — Thomas J Williams
*Assistant Examiner* — Mariano Sy

(57) ABSTRACT

A negative stiffness system for gravity compensation of a micropositioner of wafer table in lithography machine, characterized in that, the negative stiffness system includes at least three sets of quasi-zero stiffness units, each of the sets of quasi-zero stiffness units comprises a pair of negative stiffness springs and a positive stiffness spring, the positive stiffness spring is vertically positioned, the pair of negative stiffness springs are obliquely and symmetrically positioned at two sides of the positive stiffness spring, upper ends of the negative stiffness springs and the positive stiffness spring are (Continued)

connected together and fixed to the bottom surface of a rotor of the micropositioner, and lower ends of the negative stiffness springs and the positive stiffness spring are connected to a base, respectively. The system reduces the stiffness in vertical direction and prevents the influence of permanent magnet on its surroundings, while improving the bearing capacity.

3 Claims, 3 Drawing Sheets

(56) References Cited

FOREIGN PATENT DOCUMENTS

| CN | 102410337 A | 4/2012 |
|---|---|---|
| CN | 102506110 A | 6/2012 |
| CN | 102734377 A | 10/2012 |
| CN | 202520846 U | 11/2012 |
| CN | 103116249 A | 5/2013 |
| JP | H08-166043 A | 6/1996 |

OTHER PUBLICATIONS

English machine translation of CN 85109107 (Yuanqing).*
International search report for PCT/CN2013/088753 filed on Dec. 6, 2013.

* cited by examiner

NEGATIVE STIFFNESS SYSTEM FOR GRAVITY COMPENSATION OF MICROPOSITIONER

TECHNICAL FIELD

The present invention relates to a mask table of a lithography machine, particularly, to a gravity balancing system for a rotor of a micropositioner which is mainly used in a lithography machine for semiconductor process, and belongs to the field of semiconductor manufacturing equipment.

BACKGROUND ART

In many industrial manufacturing apparatuses such as wafer table or mask table in the lithography machine, a workpiece or workpiece table is required to perform a multiple-degree-of-freedom motion while being precisely positioned. In order to enable the multiple-degree-of-freedom motion and precise positioning, a drive motor may be used to directly provide the support, such that, however, the load of the drive motor is increased and so the heating of the motor is increased. In many workpiece tables of ultraprecision, the heat generated by the drive motor may influence the temperature of the atmosphere to generate a non-contact type error in measurement which may finally influence the precision of positioning. However, a gravity compensating structure can reduce the load and heating of the motor.

The non-contact type gravity compensating structure of permanent magnet has advantages. Its structure is simple and precise processing of the surface of parts or components is not required, and it can be applied in a vacuum atmosphere. However, for such non-contact type gravity compensating structure of permanent magnet, a small stiffness and large bearing capacity in the direction of axis is required between the fixing part and the supporting part. With the development of magslev workpiece table, the large-stroke motion stage of the magslev workpiece table has a large array of halbach magnetic steel to generate a strong magnetic field which may have a large influence on the gravity balancing of the rotor of the micropositioner in operation.

SUMMARY OF THE INVENTION

The object of the present invention is to provide a gravity compensating structure of negative stiffness system, in which the stiffness of the gravity support in the direction of the axis between the stator and the rotor is near to zero, and the gravity compensating structure has a relatively large bearing capacity, and a simple structure easy to process and maintain.

The technical solution of the present invention is as follows.

A negative stiffness system for gravity compensation of a micropositioner, characterized in that, the negative stiffness system includes at least three sets of quasi-zero stiffness units, each of the sets of quasi-zero stiffness units comprises a pair of negative stiffness springs and a positive stiffness spring, the positive stiffness spring is vertically positioned, the pair of negative stiffness springs are obliquely and symmetrically positioned at two sides of the positive stiffness spring, upper ends of the negative stiffness springs and the positive stiffness spring are connected together and fixed to the bottom surface of a rotor of the micropositioner, and lower ends of the negative stiffness springs and the positive stiffness spring are connected to a base, respectively.

Supposing the initial angle of each of the negative stiffness springs with respect to the horizontal plane at a steady quasi-zero stiffness point, i.e. the initial dip angle $\theta_0$ of each negative stiffness spring, corresponds to a specific stiffness ratio of the negative stiffness spring to the positive stiffness spring at a quasi-zero stiffness point, which is represented by $\alpha_{QZS}$.

$$\alpha_{QZS} = \frac{\gamma}{2(1-\gamma)}$$

Wherein, the stiffness ratio is $\alpha = k_0/k_v$;
$L_0$: initial length of each of the negative stiffness springs;
L: length of each of the negative stiffness springs that is deformed;
$\gamma$: cosine of initial dip angle of each of the negative stiffness springs, defined as $\gamma = \cos\theta_0$;
$\alpha$: length of projection of each of the negative stiffness springs in horizontal direction, defined as $\alpha = L\cos\theta$;
$k_0$: stiffness of each of the negative stiffness springs;
$k_v$: stiffness of the positive stiffness spring.

The negative stiffness system for gravity compensation of a micropositioner according to the present invention, characterized in that, the negative stiffness system is arranged in triangle when the negative stiffness system comprising three sets of quasi-zero stiffness units, and the negative stiffness system is arranged in rectangle when the negative stiffness system comprising four sets of quasi-zero stiffness units.

The present invention has the following advantages and significant effects. With the development of the magslev wafer table of the lithography machine, the micropositioner of the wafer table works in a magslev way, and the design of the micropositioner tends to be thinner and thinner, however, the present invention can avoid the influence of the magnetic steel array on the magnetic field of the Lorentz motor of the six-degree-of-freedom micropositioner, thereby improving the precision of motion, and the application of the negative stiffness system reduces the stiffness of the gravity compensating structure, which can improve the bearing capacity and isolation of vibration.

Wherein, 1—rotor of micropositioner; 2—negative stiffness unit; 3—positive stiffness unit; 4—base.

DETAILED DESCRIPTION OF THE EMBODIMENTS

The specific structures, principles and operations of the present invention will be described in detail with reference to the drawings.

Figure 1:
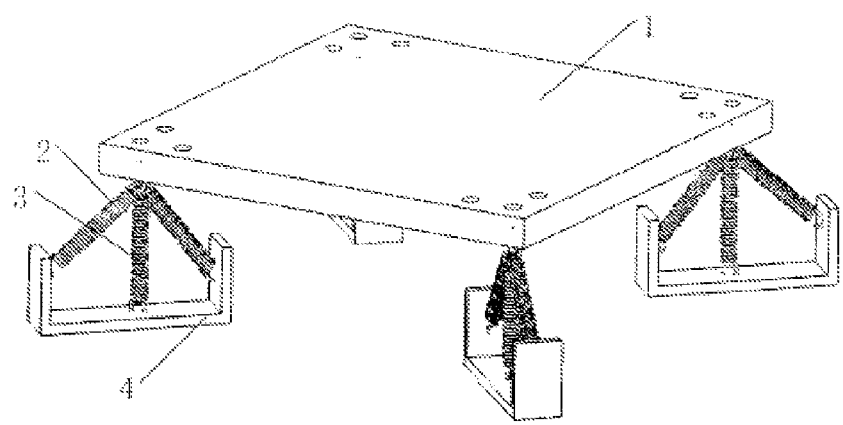
FIG. 1 is a 3D diagram of the negative stiffness system for gravity compensation of a micropositioner according to the present invention.

A negative stiffness system for gravity compensation of a micropositioner is provided, characterized in that, the negative stiffness system includes at least three sets of quasi-zero stiffness units, each of the sets of quasi-zero stiffness units comprises a pair of negative stiffness springs 2 and a positive stiffness spring 3, the positive stiffness spring 3 is vertically positioned, the pair of negative stiffness springs 2 are obliquely and symmetrically positioned at two sides of the positive stiffness spring 3, upper ends of the negative stiffness springs 2 and the positive stiffness spring 3 are connected together and fixed to the bottom surface of a rotor 1 of the micropositioner, and lower ends of the negative stiffness springs 2 and the positive stiffness spring 3 are connected to a base 4, respectively, as shown in FIG. 1.

A negative stiffness system for gravity compensation of a micropositioner is provided, wherein the negative stiffness system is arranged in triangle when the negative stiffness system comprising three sets of quasi-zero stiffness units, and the negative stiffness system is arranged in rectangle when the negative stiffness system comprising four sets of quasi-zero stiffness units.

The quasi-zero stiffness unit refers to a combination of linear elastic elements (such as springs or struts) in such a way that the stiffness of the whole unit can be 0 or near to 0 when the unit under external load is at its balanced position (quasi-zero stiffness point). The negative stiffness system of the present invention is based on the following theory.

Stiffness is generally defined as a change rate of a load exerted on an elastic unit on the deformation caused by the load, represented by K, that is:

$$K = \frac{dP}{d\delta} \quad (1)$$

Wherein, P represents load, and δ represents the deformation.

Figure 2:
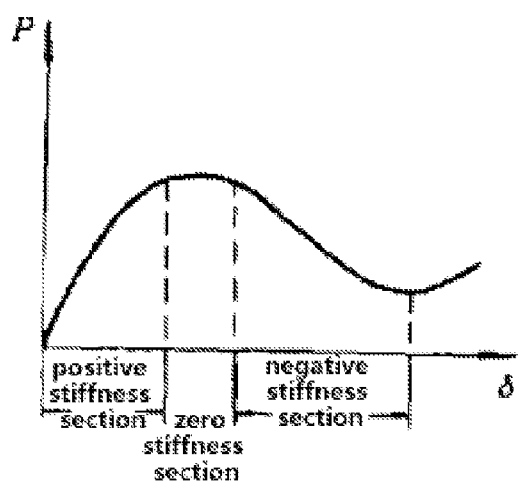
FIG. 2 is a graph illustrating the characteristic curve of negative stiffness.
Figure 3:
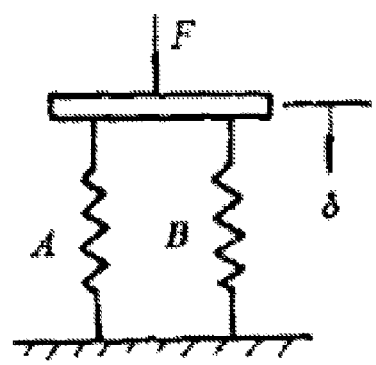
FIG. 3 illustrates a combined spring composed of the positive and negative stiffness springs.

If the load of the elastic unit increases as the deformation increases, stiffness is positive; if it does not change with the deformation increased, stiffness is zero; and if it does not increase but decrease as the deformation increases, stiffness is negative. FIG. 2 illustrates a load-deformation curve of an elastic unit in negative stiffness section and such stiffness unit can be referred as a negative stiffness spring. In physics, the negative stiffness spring is an unsteady elastic unit while the vibration system is required to be a steady system. Thus, in a vibration system, the negative stiffness spring cannot be used independently, and it has to be used in parallel with a positive stiffness spring. FIG. 3 illustrates a combined spring formed by connecting a positive stiffness spring A and a negative stiffness spring B in parallel. Supposing that a deformation of δ is generated under an external force F, and the elastic forces of the positive and negative stiffness springs are $P_v(\delta)$ and $P_0(\delta)$, respectively, the elastic force of the combined spring is:

$$P(\delta) = P_v(\delta) + P_0(\delta) = F \quad (2)$$

Figure 4:
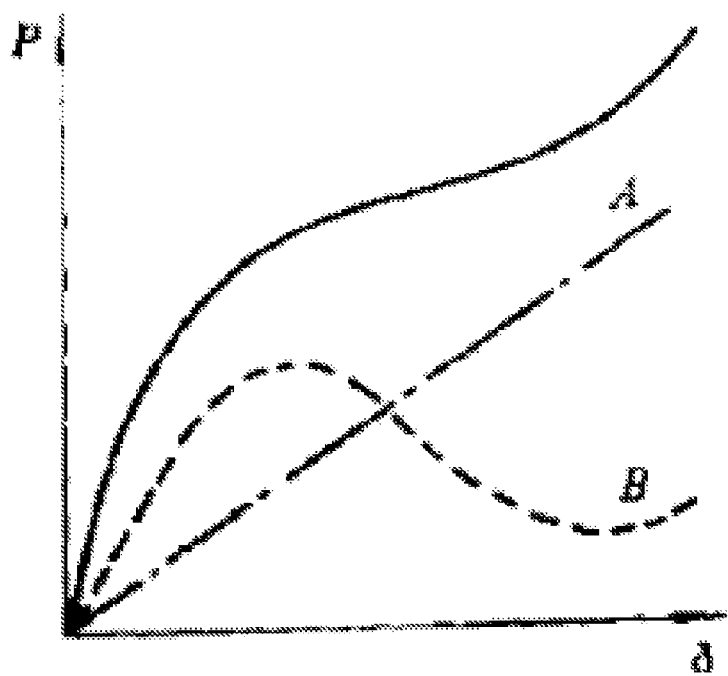
FIG. 4 is a graph illustrating the characteristic curve of the positive, negative and the combined springs.

The relation between the elastic force and deformation of the spring can be deduced from equation (2), as shown in FIG. 4.

Taking a derivative on the two sides of equation (2) with respect to δ, the following equation (3) can be deduced:

$$K = \frac{dP}{d\delta} = \frac{dP_0}{d\delta} + \frac{dP_v}{d\delta} = k_0 + k_v \quad (3)$$

Wherein, the stiffnesses of the positive stiffness spring A and the negative stiffness spring B are $k_0$ and $k_v$, and the stiffness of the combined spring is K.

It can be seen from FIG. 4 and equation (3) that, in the negative stiffness section of the negative stiffness spring, since $k_2 < 0$, the stiffness of the combined spring is algebraic sum of stiffnesses of the positive and negative stiffness springs. That is, in the negative stiffness section of the negative stiffness spring, the total stiffness of the combined spring connected in parallel is less than the stiffness of the positive stiffness spring. The reduced component in the total stiffness of the combined spring is offset by the negative stiffness spring due to the principle of stiffness offset with the positive and negative stiffness in parallel. Thus, the stiffness of the system can be reduced by connecting the positive and negative stiffness springs in parallel. It can be also seen form FIG. 4 that, in the negative stiffness section of the negative stiffness spring, the total elastic force, i.e., the total load capacity of the combined spring is larger than the positive stiffness spring when used alone, although the total stiffness of the combined spring is less than the stiffness of the positive stiffness spring when used alone. Therefore, an elastic element having a low stiffness and a large load capacity can be composed by connecting the positive and negative stiffness springs in parallel.

Figure 5:
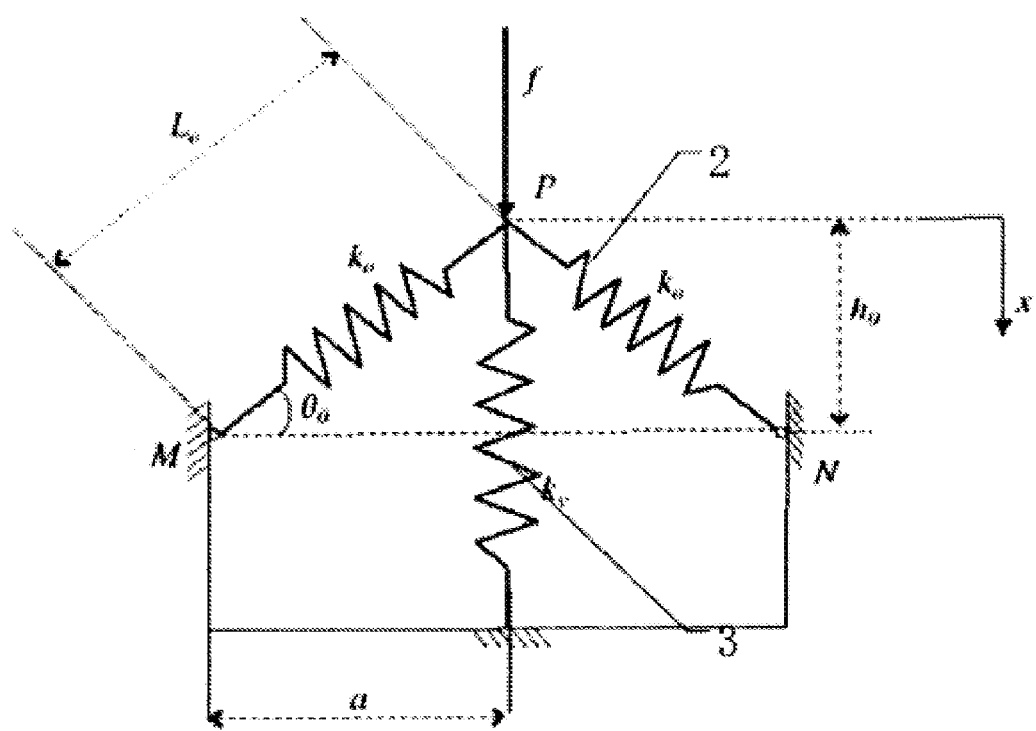
FIG. 5 is a diagram of the simplified model of the quasi-zero stiffness unit of the negative stiffness system according to the present invention.

In addition, the restoring force f of the spring can be deduced from the geometric relationship in FIG. 5, that is:

$$f = k_v x + 2\alpha k_0 (L_0 - L) \sin \theta \quad (4)$$

Wherein, $L_0 = \sqrt{h_0^2 + \alpha^2}$, $L = \sqrt{(h_0 - x)^2 + \alpha^2}$, in which, L: length of the negative stiffness spring that is deformed;
$\theta_0$: initial angle of the negative stiffness spring with respect to the horizontal plane, i.e. the initial dip angle of the negative stiffness spring;
$\theta$: angle of the negative stiffness spring with respect to the horizontal plane after deformation, i.e. the dip angle of the negative stiffness spring after deformation;
$\gamma$: cosine of the initial dip angle of the negative stiffness spring, defined as $\gamma = \cos \theta_0$;
$\alpha$: length of projection of the negative stiffness spring in horizontal direction, defined as $\alpha = L \cos \theta$, and it is a constant as all movements are in vertical direction in the system;
$h_0$: length of projection of the negative stiffness spring in vertical direction in the initial state, defined as $h_0 = L_0 \sin \theta_0$;
x: displacement of the quasi-zero stiffness unit in vertical direction when under an external force;
$k_0$: stiffness of the negative stiffness spring;
$k_v$: stiffness of the positive stiffness spring;
K: total stiffness of the quasi-zero stiffness unit;
$\alpha$: stiffness ratio, defined as $\alpha = k_0/k_v$;
f: external load of the quasi-zero stiffness unit, generally in vertical direction.

Since $\alpha = k_0/k_v$, substitute $L_0$, L into equation (4), and in combination with $\sin \theta = (h_0 - x)/L$, it can be derived that:

$$f = k_v x + 2\alpha k_v (h_0 - x)\left(\frac{\sqrt{h_0^2 + a^2}}{\sqrt{(h_0 - x)^2 + a^2}} - 1\right) \quad (5)$$

Both sides of equation (5) divided by $L_0 k_v$ to be dimensionless, that is, $$\hat{f} = \hat{x} + 2\alpha(\sqrt{1-\gamma^2} - \hat{x})\{[\hat{x}^2 - 2\hat{x}\sqrt{1-\gamma^2} + 1]^{-1/2} - 1\} \quad (6)$$

Both sides of equation (6) divided by displacement x, the stiffness in a dimensionless form can be derived:

$$\hat{K} = 1 + 2\alpha \left[ 1 - \frac{\gamma^2}{(\hat{x}^2 - 2\hat{x}\sqrt{1-\gamma^2} + 1)^{3/2}} \right] \quad (7)$$

It can be derived form equation (7) that when the stiffness of the system $\hat{K}$ is minimal (equal to 0), $\hat{x} = \widehat{x_e} = \sqrt{1-\gamma^2}$. Here, when the initial dip angle is given, let the above equation to be zero, the unique stiffness ratio $\alpha_{QZS}$ of the quasi-zero stiffness can be solved, that is:

$$\alpha_{QZS} = \frac{\gamma}{2(1-\gamma)}$$

And, the quasi-zero stiffness point is located at $\hat{x} = \widehat{x_e} = \sqrt{1-\gamma^2}$, that is, at $\hat{x} = \sqrt{1-\gamma^2}$.

Also, it can be known that the initial dip angle of negative stiffness spring can be solved when the stiffness ratio of the system is given, and the relationship is represented as:

$$\gamma_{QZS} = \frac{2\alpha}{2\alpha + 1}$$

And, the quasi-zero stiffness point is located at $\hat{x} = \widehat{x_e} = \sqrt{1-\gamma_{QZS}^2}$.

In the present embodiment, the simplified model is shown in FIG. 5. When it is designated that $\alpha = 0.5$, it can be solved that $\gamma_{QZS} = 0.5$, $\hat{x} = \sqrt{1-\gamma^2} = 0.866$. Supposing that the mass of a ball is 4 kg, and the acceleration of gravity is 9.8 N/Kg, then the force of gravity on the ball is 39.2 N, and substitute this value into equation (6), it can be solved that $k_v L_0$ is 45.26 N. On the assumption that the length of the spring is 0.2 m, it can be solved that the stiffness of the vertical spring is 226.3 N/m, and the stiffness of the oblique spring is 113.15 N/m.

A simulation is performed based on the design parameters utilizing ABAQUS. Considering the ball as a rigid body, the stiffness of the vertical spring is 226.3 N/m, the stiffness of the oblique spring is 113.15 N/m, and the length of each of the springs is 0.2 m, and the dip angle of the oblique spring is 60°. A concentrated load of 100 N is applied at the reference point of the rigid body. Through static force analysis, a force-time curve and a displacement-time curve are calculated and obtained, and further in combination with a time-force curve, a force-displacement curve is derived. From the force-displacement curve it can be seen that when the load is increased to 39 N, the slope of the curve tends to be 0 which means that the stiffness is getting close to 0 while the displacement of the spring is 0.152 m. When the load is increased to 40 N, the displacement of the ball is 0.207 m, that is, when the load increases by 1 N, the displacement increases by 0.055 m. It can be determined that the stiffness of the system is rather small when the displacement is in a range of 0.152~0.207 m, and the analytic solution $x_e l_0 = 0.173$ m also falls in this range, verifying the correctness of the simulation, and then it can be determined that the ball can be in a quasi-zero stiffness state when only under gravity. The curves of restoring force of the negative stiffness spring and the positive stiffness spring can be calculated and obtained which show that, at t=0.39 s, the restoring force of the negative stiffness spring decreases rapidly and the restoring force of the positive stiffness spring increases rapidly and the static force balance of the ball can be achieved, thus the vertical displacement increases sharply at t=0.39 s. Then, it can be determined that the above structure can be applied in the gravity balancing structure of the micropositioner.

What is claimed is:

1. A negative stiffness system for gravity compensation of a micropositioner, wherein the negative stiffness system includes at least three sets of quasi-zero stiffness units, each of the sets of quasi-zero stiffness units comprises a pair of negative stiffness springs and a positive stiffness spring, the positive stiffness spring is vertically positioned, the pair of negative stiffness springs are obliquely and symmetrically positioned at two sides of the positive stiffness spring, upper ends of the negative stiffness springs and the positive stiffness spring are connected together and fixed to a bottom surface of a rotor of the micropositioner, and lower ends of the negative stiffness springs and the positive stiffness spring are connected to a base, respectively,
   wherein an initial angle $\theta_0$ of each of the negative stiffness springs with respect to a horizontal plane satisfies the following specific stiffness ratio $\alpha_{QZS}$ of each of the negative stiffness springs to the positive stiffness spring at a quasi-zero stiffness point;

$$\alpha_{QZS} = \frac{\gamma}{2(1-\gamma)},$$

wherein, the stiffness ratio $\alpha_{QZS}$ is $k_0/k_v$;
$L_0$: an initial length of each of the negative stiffness springs;
L: a length of each of the negative stiffness springs that is deformed;
$\gamma$: cosine of the initial angle $\theta_0$ of each of the negative stiffness springs, defined as $\gamma = \cos \theta_0$;
$\alpha$: a length of projection of each of the negative stiffness springs in a horizontal direction, defined as $\alpha = L \cos \theta_0$;
$k_0$: a stiffness of each of the negative stiffness springs; and
$k_v$: a stiffness of the positive stiffness spring,
wherein the base includes a first sidewall portion, a second sidewall portion, and a middle portion, the middle portion being disposed between the first sidewall portion and the second sidewall portion to connect the first and second sidewall portions,
wherein each of the lower ends of the negative stiffness springs are connected to an inner surface of a corresponding one of the first and second sidewall portions, and
wherein the lower end of the positive stiffness spring is connected to a top surface of the middle portion.

2. The negative stiffness system according to claim 1, wherein when the negative stiffness system comprises three sets of quasi-zero stiffness units, the three sets of quasi-zero stiffness units are arranged in a triangle, and
   wherein when the negative stiffness system comprises four sets of quasi-zero stiffness units, the four sets of quasi-zero stiffness units are arranged in a rectangle.

3. The negative stiffness system according to claim 1, wherein the upper ends of the negative stiffness springs and the upper end of the positive stiffness spring are directly connected together.

* * * * *